United States Patent
Kinoshita

(12) 
(10) Patent No.: US 6,288,830 B1
(45) Date of Patent: Sep. 11, 2001

(54) OPTICAL IMAGE FORMING METHOD AND DEVICE, IMAGE FORMING APPARATUS AND ALIGNER FOR LITHOGRAPHY

(75) Inventor: Makoto Kinoshita, Tottori (JP)

(73) Assignee: Ricoh Microelectronics Company, Ltd., Tottori (JP)

( * ) Notice: Subject to any disclaimer, the term of this patent is extended or adjusted under 35 U.S.C. 154(b) by 0 days.

(21) Appl. No.: 09/310,131

(22) Filed: May 12, 1999

(30) Foreign Application Priority Data

May 13, 1998 (JP) .................................................. 10-148449

(51) Int. Cl.[7] .................................................. G02B 26/00
(52) U.S. Cl. .............................. 359/292; 359/224; 355/67
(58) Field of Search .................................. 359/202, 212, 359/223, 224, 260–292, 295, 298, 205, 846, 849, 850, 867; 355/67

(56) References Cited

U.S. PATENT DOCUMENTS

| | | |
|---|---|---|
| 4,393,387 | 7/1983 | Kitamura .............................. 347/240 |
| 4,842,396 | 6/1989 | Minoura et al. ..................... 359/212 |
| 4,940,314 * | 7/1990 | Hecht ................................... 359/276 |
| 5,028,939 * | 7/1991 | Hornbeck et al. .................... 347/134 |
| 5,041,851 * | 8/1991 | Nelson ................................. 347/134 |
| 5,061,049 * | 10/1991 | Hornbeck ............................ 359/224 |
| 5,083,857 * | 1/1992 | Hornbeck ............................ 359/291 |
| 5,499,138 * | 3/1996 | Iba ....................................... 359/569 |
| 5,614,937 * | 3/1997 | Nelson ................................. 347/240 |
| 5,621,499 * | 4/1997 | Shiozawa ............................... 355/67 |
| 5,633,737 * | 5/1997 | Tanaka et al. ......................... 349/95 |
| 5,684,566 * | 11/1997 | Stanton ................................... 355/67 |
| 5,729,276 * | 3/1998 | Nelson ................................. 347/240 |
| 5,754,217 * | 5/1998 | Allen ................................... 347/239 |
| 5,771,060 * | 6/1998 | Nelson ................................. 347/239 |
| 5,880,887 * | 3/1999 | Goto ..................................... 359/626 |
| 5,936,774 * | 8/1999 | Street ................................... 359/630 |
| 5,963,305 * | 10/1999 | Mizouchi ............................... 355/67 |
| 5,990,992 * | 11/1999 | Hamanaka et al. ................... 349/95 |
| 6,094,294 * | 7/2000 | Yokoyama et al. .................. 359/290 |

FOREIGN PATENT DOCUMENTS

| | | |
|---|---|---|
| 0 640 488 | 3/1995 | (EP) . |
| 0 739 125 | 10/1996 | (EP) . |
| 0 795 771 | 9/1997 | (EP) . |
| 2 123 247 | 1/1984 | (GB) . |
| 08-129138 A * | 5/1996 | (JP) . |
| 08-313842 A * | 11/1996 | (JP) . |

* cited by examiner

Primary Examiner—Evelyn A Lester
(74) Attorney, Agent, or Firm—Oblon, Spivak, McClelland, Maier & Neustadt, P.C.

(57) ABSTRACT

An optical image forming method and device, an image forming apparatus, and an aligner for lithography, capable of forming a light image at a high pixel density and enhancing the intensity of irradiated light to each pixel by effectively utilizing reflected light from respective mirrors of a spatial light modulator. The optical image forming device has a light source, a DMD including a plurality of mirrors, each capable of independently controlling the inclination of a reflecting surface thereof for reflecting light from the light source, wherein reflected light from the DMD is irradiated to an object moving in one direction relative to the reflected light to form a light image on the object. The respective mirrors of the DMD are arranged such that reflected light images therefrom are aligned on the object in a direction orthogonal to the direction of the relative movement, with a pitch smaller than the pitch p of the mirrors. A controller controls the inclination of the reflecting surface of each of the mirrors. A microlens including a plurality of lenses converges reflected light from corresponding mirrors of the DMD onto the object.

6 Claims, 4 Drawing Sheets

OPTICAL IMAGE FORMING METHOD AND DEVICE, IMAGE FORMING APPARATUS AND ALIGNER FOR LITHOGRAPHY

BACKGROUND OF THE INVENTION

1. Field of the Invention

The present invention relates generally to an optical image forming method and device for forming a light image on an object, and more particularly to an optical image forming method and device for forming a light image on an object which moves in one direction relative to reflected light irradiated thereto from a spatial light modulator including a plurality of mirrors each capable of independently controlling the inclination of its reflecting surface, as well as to a printer, an image forming apparatus such as a copying machine, and an aligner for lithography, all of which may utilize the device.

2. Description of the Related Art

Conventionally, a device named a digital micromirror device (hereinafter referred to as the "DMD") is known as a spatial light modulator of the type mentioned above. Specifically, the DMD has a multiplicity of micromirrors, referred to as micromirrors, each rotatable about a fixed axis, formed on a semiconductor substrate of Si or the like. The DMD is irradiated with light from a light source which is deflected by each of the micromirrors, the rotation of which is controlled by an electrostatic action or the like. Each of the micromirrors is selectively rotated to change the inclination of its reflecting surface to selectively irradiate an object with reflected light from each of the micromirrors to form a light image on the object.

Originally, the DMD has been proposed for applications in a display such as a digital large screen projector or the like. Recently, however, applications proposed for the DMD have been increasingly directed to an optical writing system for writing a laser beam onto a photosensitive material in an image forming apparatus such as an electrophotographic printer, as described in, for example, Laid-open Japanese Patent Applications Nos. 8-318641, 7-232458 and 9-300701. Particularly, the Application No. 8-318641 describes a method of forming all pixels in the axial direction of a photosensitive material using a DMD having a small number of mirrors and a reduced device length in the axial direction (longitudinal direction). Specifically, the DMD is composed of a plurality of mirror columns arranged in a direction in which the surface of a photosensitive material, as an object, is moved, wherein each of the mirror columns includes a plurality of mirrors arranged in an axial direction, orthogonal to the surface moving direction, and effective reflecting surfaces of mirrors in each mirror column are shifted in the axial direction, so that one line portion of a light image on a photosensitive material is formed using the plurality of mirror columns of the DMD.

In the method disclosed in the above-mentioned Laid-open Japanese Patent Application No. 8-318641, the object is irradiated only with a portion of reflected light from each mirror in order to prevent reflected light images of the respective mirrors from overlapping with each other in the direction orthogonal to the direction of the relative movement of the object, so that the irradiating light having only a reduced intensity reaches each of pixels on the object (photosensitive material). This also leads to a requirement for a technique of irradiating respective pixels with reflected light from the mirrors a plurality of times.

On the other hand, while the pixel density tends to be higher in the field of modern image forming apparatus or the like, the present inventors have found that the pixel density can be significantly improved in the formation of a light image on an object such as a photosensitive material even without the need for increasing the number of mirrors in the direction orthogonal to the direction of the relative movement of the object in a spatial light modulator such as the above-mentioned DMD.

OBJECT AND SUMMARY OF THE INVENTION

The present invention has been made in view of the problems mentioned above, and its object is to provide an optical image forming method and device which are capable of forming a light image in a high pixel density and of enhancing the intensity of light irradiated to each pixel by effectively utilizing reflected light from respective mirrors of a spatial light modulator. Another object of the present invention is to provide an image forming apparatus and an aligner for lithography using the device.

To achieve the above objects, in a first aspect, the present invention provides an optical image forming method for forming a light image on an object which includes the steps of irradiating light from a light source to a spatial light modulator including a plurality of mirrors, wherein each of the mirrors is capable of independently controlling the inclination of a reflecting surface thereof, irradiating reflected light from the spatial light modulator to an object which moves in one direction relative to the reflected light, arranging the respective mirrors of the spatial light modulator to reflect light therefrom such that reflected light images from the mirrors of the spatial light modulator are aligned on the object in a direction orthogonal to the direction of the relatively movement with a pitch smaller than the pitch p of the mirrors, and converging reflected light from the respective mirrors of the spatial light modulator onto the object.

In this optical image forming method, reflected light images from the mirrors of the spatial light modulator are aligned on the object in the direction orthogonal to the direction of the relative movement with a pitch smaller than the pitch p of the mirrors, and reflected light from each of the mirrors of the spatial light modulator is converged onto the object, thereby forming a light image at a high pixel density on the object. Here, the reflected light from the respective mirrors of the spatial light modulator is converged onto the object to effectively utilize the reflected light from the respective mirrors, thereby enhancing the intensity of irradiated light in respective pixels.

In a second aspect, the present invention provides an optical image forming device for forming a light image on an object, which includes a light source, a spatial light modulator including a plurality of mirrors, each of which is capable of independently controlling the inclination of a reflecting surface thereof for reflecting light from the light source, wherein reflected light from the spatial light modulator is irradiated to an object which moves in one direction relative to the reflected light, a controller which controls the inclination of the reflecting surface of each of the mirrors such that reflected light images from the respective mirrors of the spatial light modulator are aligned on the object in a direction orthogonal to the direction of the relative movement with a pitch smaller than the pitch p of the mirrors, and a plurality of lenses each for converging reflected light from a corresponding mirror of the spatial light modulator onto the object.

In the optical image forming device, the respective mirrors are arranged at predetermined positions, and the controller controls the inclination of the reflecting surface of each of the mirrors such that reflected light images from the respective mirrors of the spatial light modulator are aligned on the object in a direction orthogonal to the direction of the relative movement with a pitch smaller than the pitch p of the mirrors. Then, the reflected light from the respective mirrors is converged onto the object by the plurality of lenses to form a light image at a high pixel density on the object. In this event, the reflected light from the respective mirrors is converged by the lenses to effectively utilize the reflected light from the respective mirrors, thereby enhancing the intensity of irradiated light in respective pixels.

The reflected light from the respective mirrors may be converged on the object in such a degree to prevent overlapping, or may be converged to permit slight overlapping.

The spatial light modulator may include n mirror rows arranged in the direction of the relative movement, wherein each of the mirror rows is composed of m mirrors arranged with the pitch p in the direction orthogonal to the direction of the relative movement, and the mirror rows are arranged with an offset in the direction orthogonal to the direction of the relative movement. In this embodiment, the controller may control the inclination of the reflecting surface of each of the mirrors, such that reflected light images from the respective mirrors are aligned in the direction orthogonal to the direction of the relative movement.

The n mirror rows, arranged in the direction of the relative movement, are each composed of m mirrors arranged with the pitch p in the direction orthogonal to the direction of the relative movement, wherein the mirror rows are arranged with an offset in the direction orthogonal to the direction of the relative movement, such that the reflected light image from the respective mirrors are arranged in the direction orthogonal to the direction of the relative movement. Then, the controller controls the inclination of the reflecting surface of each of the mirrors, such that reflected light images from the respective mirrors are aligned in the direction orthogonal to the direction of the relative movement.

Also, the spatial light modulator may include n mirror rows arranged in the direction orthogonal to a longitudinal direction of the spatial light modulator, wherein each of the mirror rows includes m mirrors arranged with the pitch p in the longitudinal direction, to form an array of (n×m) mirrors which constitute the spatial light modulator, and the longitudinal direction of the spatial light modulator is inclined with respect to the direction orthogonal to the direction of the relative movement, so as to sequentially shift the position at which a reflected light image reflected off an $i^{th}$ mirror (i=1 to m) in each of the mirror rows is formed in the direction orthogonal to the direction of the relative movement. In this embodiment, the controller may control the inclination of the reflecting surface of each of the mirrors such that reflected light images from the respective mirrors are aligned in the direction orthogonal to the direction of the relative movement.

Each of the n mirror rows, arranged in the direction orthogonal to the longitudinal direction of the spatial light modulator, includes m mirrors arranged with the pitch p in a longitudinal direction of the spatial light modulator, to form an array of (n×m) mirrors constituting the spatial light modulator, wherein the longitudinal direction of the spatial light modulator is inclined with respect to the direction orthogonal to the direction of the relative movement, so as to sequentially shift the position at which a reflected light image reflected off an $i^{th}$ mirror (i=1 to m) in each of the mirror rows is formed in the direction orthogonal to the direction of the relative movement, thereby arranging reflected light images from the respective mirrors in the direction orthogonal to the direction of the relative movement. Then, the controller controls the inclination of the reflecting surface of each of the mirrors such that reflected light images from the respective mirrors are aligned in the direction orthogonal to the direction of the relative movement.

The pitch with which the reflected light images from the respective mirrors are arranged in the direction orthogonal to the direction of the relative movement may be set at the value of (p/n). Alternatively, the pitch may be set at any appropriate value.

In a third aspect, the present invention provides an image forming apparatus including a latent image forming mechanism which irradiates a light image to a uniformly charged image carrier to form a latent image, a developing mechanism which develops the latent image on the image carrier to form an actual image, and a transfer mechanism which transfers the actual image on the image carrier onto a transfer material, wherein the aforementioned optical image forming device is used as the latent image forming mechanism.

In the image forming apparatus, reflected light from the respective mirrors or the spatial light modulator is converged by the lenses to irradiate the uniformly charged image carrier with the converged light, thereby making it possible to enhance the intensity of the irradiated light to each pixel and to form a latent image at a high pixel density on the image carrier.

In a fourth aspect, the present invention provides an aligner for lithography for irradiating a light image to a substrate having a photoresist layer formed on a surface thereof, including the aforementioned optical image forming device for irradiating the substrate with a light image.

In the aligner for lithography, reflected light from the respective mirrors of the spatial light modulator is converged by the lenses to irradiate the converged light to the surface of the substrate having the photoresist layer formed thereon, thereby making it possible to enhance the intensity of the irradiated light to each pixel and to form a resist pattern at a high pixel density on the substrate.

Other objects, features, and advantages of the present invention will become apparent from the following detailed description when read in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Several embodiments of the present invention will hereinafter be described with reference to the accompanying drawings.

[Embodiment 1]

Figure 1A:
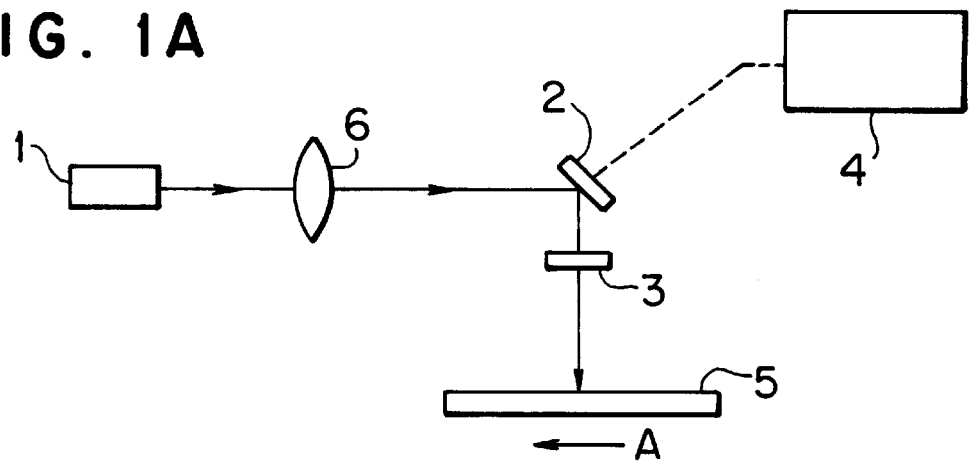
FIG. 1A is a schematic diagram illustrating an optical image forming device according to a first embodiment of the present invention.

FIG. 1A schematically illustrates the structure of an optical image forming device which can embody an optical image forming method according to the present invention. The illustrated device includes a light source 1; a digital micromirror device (DMD) 2 including a plurality of mirrors each capable of independently controlling the inclination of its reflecting surface and serving as a spatial light modulator; a microlens 3 including a plurality of miniature lenses for converging reflected light from respective mirrors of the DMD 2 onto a light image forming object (hereinafter referred to as the "object") 5 which moves in a direction indicated by an arrow A; and a controller 4 which controls the inclination of the reflecting surface of each mirror in the DMD 2 based on image data.

The light source 1 may be implemented by a light emitting diode, a laser or the like, other than an ordinary lamp. In the example illustrated in FIG. 1A, light from the light source 1 is transformed into substantially a parallel beam through a collimator lens 6, and is irradiated to a mirror surface of the DMD 2. A slit may be inserted between the light source 1 and the DMD 2 as required.

Figure 1B:
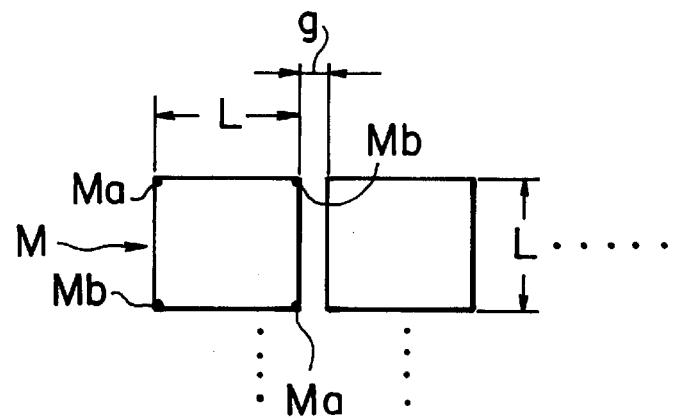
FIG. 1B is a schematic diagram illustrating the shape of mirrors constituting a DMD in the optical image forming device of FIG. 1A.

The DMD 2 includes, as illustrated in FIG. 1B, a multiplicity of mirrors M each formed in a square having a side length L which is 16 $\mu$m in the present embodiment. Respective adjacent mirrors are spaced by a gap set at 1 $\mu$m.

Each mirror M is structured such that a movable end Mb swings about the diagonal connecting two fixed ends Ma to incline the reflecting surface. In the example illustrated in FIG. 1B, the movable end Mb swings upon receiving an electrostatic force induced by an electric field generated at an electrode on a substrate, not shown.

Figure 1C:
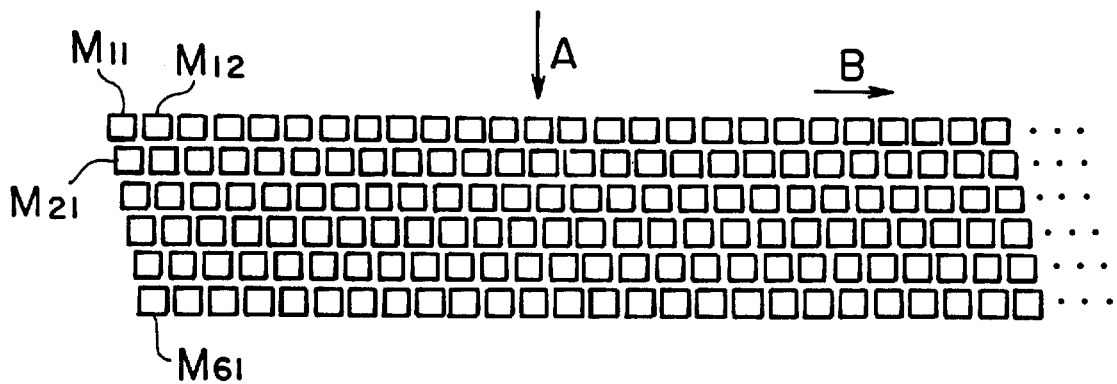
FIG. 1C is a diagram illustrating the arrangement of mirrors in the DMD.

FIG. 1C illustrates an array of mirrors M of the DMD 2 viewed through from the rear side of the DMD 2. Referring specifically to FIG. 1C, there are n mirror rows (here n=6) arranged in a direction in which the object 5 is moved. Each mirror row includes m (representing the range of several hundreds) mirrors arranged with a pitch p (=17 $\mu$m) in the direction orthogonal to the moving direction of the object 5 (hereinafter referred to as the "orthogonal direction" and indicated by an arrow B in FIG. 1C). Also, the respective mirror rows are shifted by p/n (approximately 2.8 $\mu$m) from the preceding and/or subsequent ones in the orthogonal direction.

The microlens 3 includes a plurality of lenses, each of which converges reflected light from a reflecting surface R of a corresponding one of the mirrors M to irradiate the object 5 with a reflected light image in the form of a spot S having the size of one pixel. The characteristic of the microlens 3 is set such that the spot S has one side equal to the above-mentioned shift amount p/n (approximately 2.8 $\mu$m) and an area approximately 1/36 the reflecting surface. The microlens 3 may by implemented, for example, by an equivalent of a microlens used to converge light onto each of light receiving elements on a sensing surface of an imaging device such as a CCd or the like.

The controller 4 includes an image data processing unit and a mirror drive control unit. The image data processing unit generates time-series drive control data for controlling and driving the respective mirrors of the DMD 2 based on image data sent thereto from an external computer, image data generated by reading an original through a scanner, or the like.

Figure 2A:
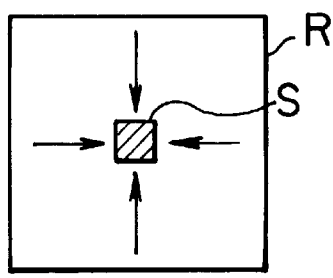
FIG. 2A is a schematic diagram illustrating the relationship between a reflecting surface R of a mirror in the DMD and a pixel spot S on an object.
Figure 2B:
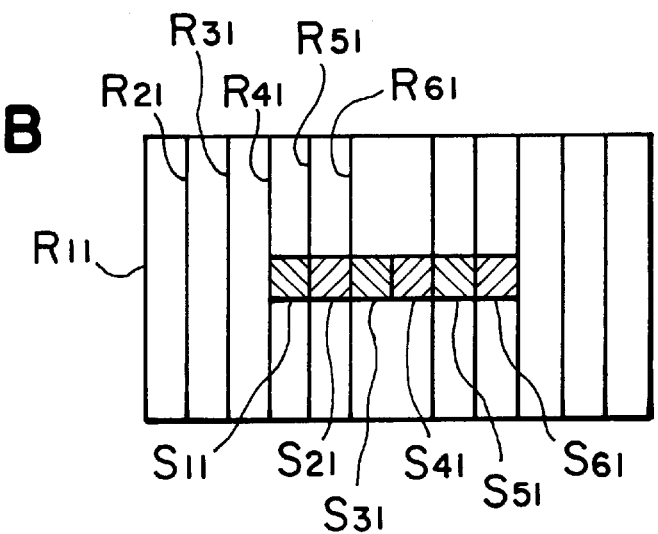
FIG. 2B is a schematic diagram illustrating columns of pixels formed on an object.

The mirror drive control unit of the controller 4, in turn, controls the inclination of the reflecting surface of each mirror in the DMD 2 in the following manner based on the drive control data generated by the image data processing unit. In the following, description is made as to how to contol pixels in the first line of a light image formed on an object. First, refelcted light from a first mirror row M1i (i=1 to m) in FIG. 1 is converged as illustrated in FIG. 2A, and irradiated onto the object 5. Next, reflected light from a second mirror M2i (i=1 to m) in FIG. 1C is converged and irradiated onto the object 5 in a similar manner at timing after a time equal to the pitch p' of pixels on the object 5 divided by a moving speed V of the object 5 (p'/V). The DMD 2 is controlled to repeat the foregoing irradiation for the remaining mirror rows to form the object with pixels S11–S61, S12–S62, and so on, aligned in the orthogonal direction B, as illustrated in FIG. 2B (illustration of pixels S12–S62, and so on are omitted in FIG. 2B). The second and subsequent lines are formed by similarly controlling the DMD 2.

In this way, the optical image forming device according to Embodiment 1 can significantly enhance the pixel density of a light image formed on the object 5 without increasing the number of mirrors in the orthogonal direction. The pixel density in the example illustrated in FIGS. 1 and 2 is enhanced at a stretch six (equal to the number of mirror rows) times as high as that of a light image which may be formed by irradiating an object with reflected light from one mirror row without changing its area.

In addition, reflected light from the respective mirrors M can be effectively utilized to enhance the intensity of irradiated light at each pixel, as compared with the use of only a portion of reflecting surfaces of the respective mirrors in the DMD 2.

Figure 3:
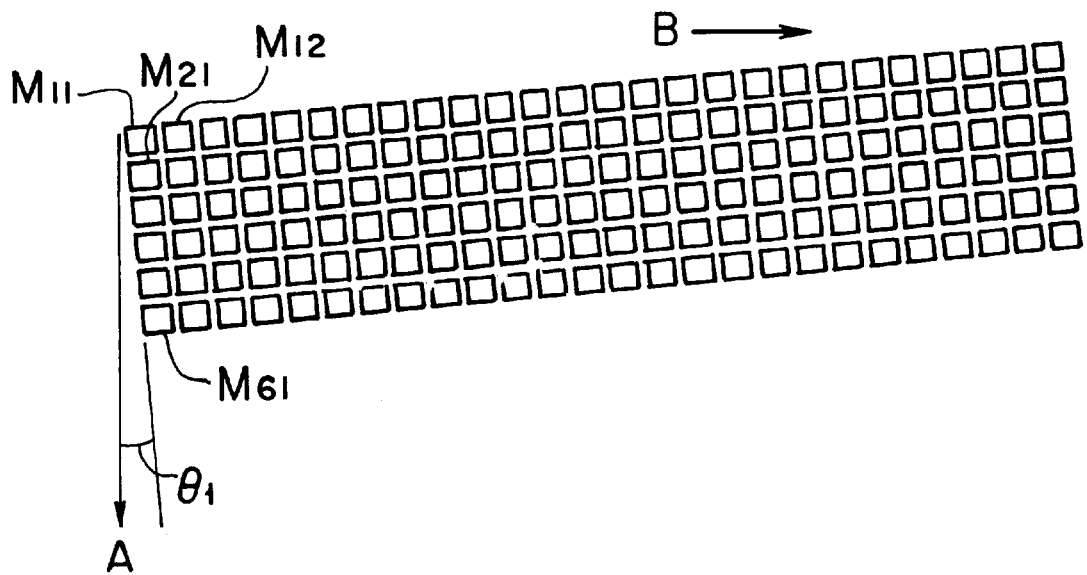
FIG. 3 is a schematic diagram illustrating the arrangement of mirrors in the DMD according to a modified example.

It should be noted that while this embodiment employs the DMD 2 which is formed of the mirror rows sequentially shifted in the orthogonal direction, the DMD 2 may be formed of an array of mirrors, each of which has the longitudinal direction inclined by a predetermined angle θ1 with respect to the orthogonal direction B as illustrated in FIG. 3. Referring specifically to FIG. 3, a DMD 2 includes n mirror rows arranged in the direction orthogonal to the longitudinal direction, each of which includes m mirrors arranged in the longitudinal direction with a pitch p, thus configuring the mirrors in the form of an (n×m) array. Then, the inclination angle θ1 of the DMD 2 is set such that the position at which a reflected light image reflected off an i$^{th}$ mirror (i=1 to m) in each mirror row is formed in the orthogonal direction B is sequentially shifted by approximately (p/n). The respective mirrors in the DMD 2 are controlled such that reflected light images therefrom are aligned in the orthogonal direction B.

Also, the mirrors constituting the DMD 2 used in this embodiment are not limited in shape and size to a square having a side length of 16 μm. as mentioned above, but may be varied depending on restrictions possibly imposed by a manufacturing process of the DMD 2, the whole configuration of the optical image forming device, or the like.

Further, in this embodiment, a light image irradiated to the object 5 may be optionally enlarged or reduced in general depending on the size of the object 5.

Figure 4:
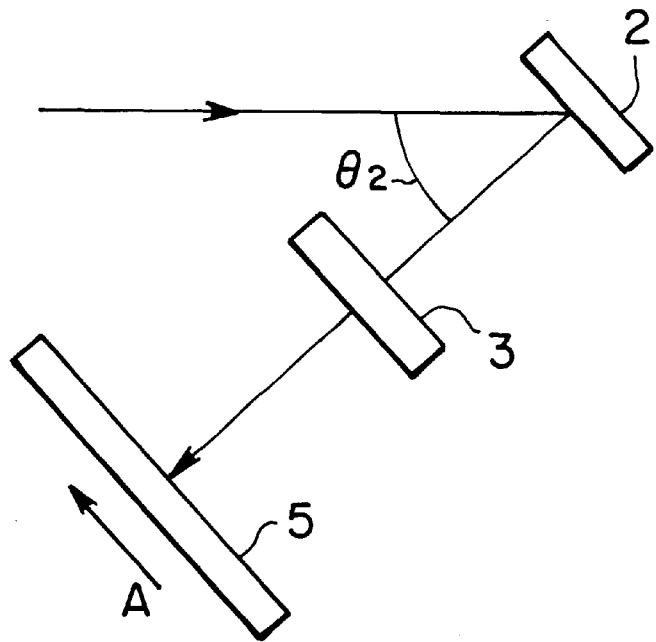
FIG. 4 is a schematic diagram illustrating positioning of a microlens and an object according to a modified example.
Figure 5:
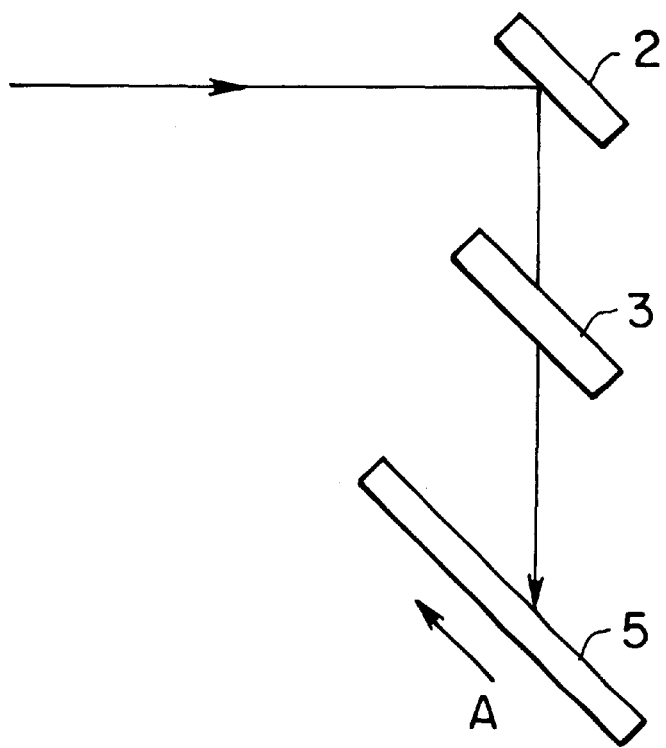
FIG. 5 is a schematic diagram illustrating positioning of a microlens and an object according to another modified example.

Further, in this embodiment, the angle θ2 formed by the optical axis of incident light to the DMD 2 and the optical axis of light emitted from the DMD 2 is preferably as small as possible, as illustrated in FIG. 4, to reduce variations in the distance between each of the mirrors and a corresponding lens in the microlens 3 in order to prevent the light image from each mirror from being out of focus on the object. Also, as illustrated in FIG. 5, the DMD 2, the microlens 3 and the irradiated surface of the object 5 may be arranged in parallel with each other with the angle θ2 maintained at approximately 90°, so as to eliminate variations in the distance between each mirror and a corresponding lens in the microlens 3 and in the distance between each lens and the irradiated surface of the object 5. Furthermore, the configurations illustrated in FIGS. 4 and 5 may be combined.

[Embodiment 2]

Figure 6:
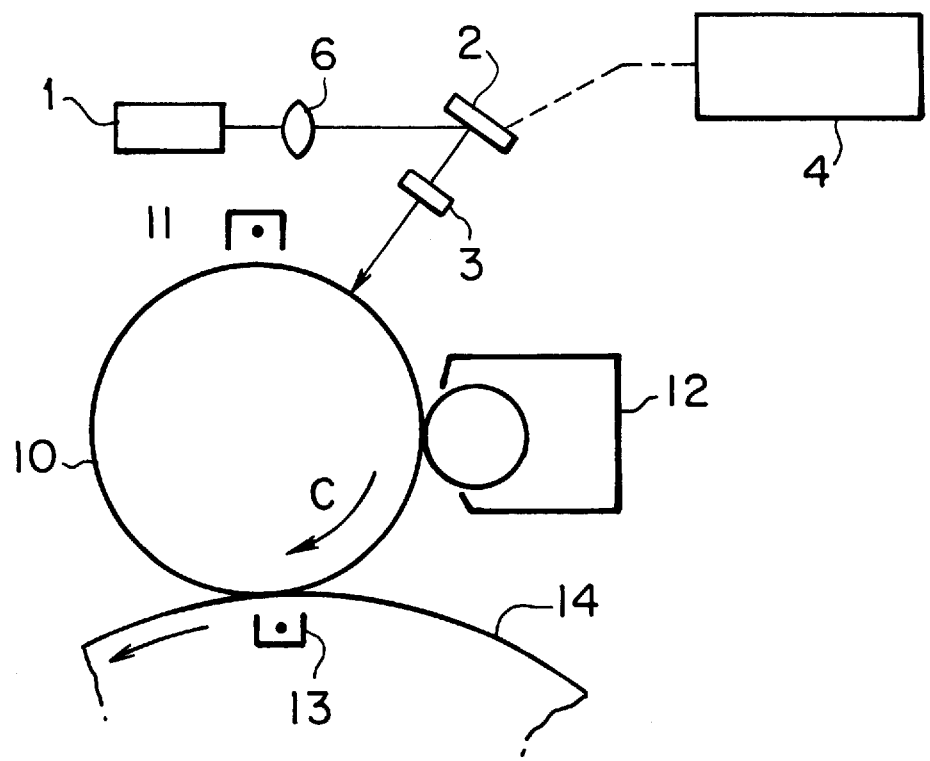
FIG. 6 is a schematic diagram illustrating the configuration of a printer according to a second embodiment.

Next, description will be made on a exemplary application for the DMD 2 which is employed in a printer serving as an image forming device. FIG. 6 schematically illustrates the configuration of a printer according to this embodiment, wherein parts similar to those in FIG. 1A of the foregoing Embodiment 1 are designated with the same reference numerals, and explanation thereon is omitted.

Referring specifically to FIG. 6, the surface of a drum-shaped photosensitive material 10, serving as an image carrier rotated in a direction indicated by an arrow C, is uniformly charged by a charger 11, and exposed to a light image from the DMD 2 which is controlled on the basis of image data sent from an external device such as a personal computer. In this way, an electrostatic latent image is formed on the photosensitive material 10. The electrostatic latent image on the photosensitive material 10 is developed into a toner image as supplied toner particles selectively attach thereto in a developer 12. The toner image on the photosensitive material 10 is transferred to a transfer sheet 14 as a transfer material by a transfer unit 13.

Thus, when the aforementioned DMD 2 is applied to a printer for forming an image on a transfer sheet 14, the axial direction of the photosensitive material corresponds to the orthogonal direction B. The size, number and so on of mirrors M in the DMD 2 are set based on the width of an image in the axial direction of the photosensitive material 10, and an intended pixel density. Assuming for example that an image having a width of 200 mm in the axial direction of the photosensitive material 10 is formed at an intended pixel density of 1200 dpi (dot per inch), the DMD 2 will have approximately 9,450 pixels in the width direction of the image. Thus, employing the DMD 2 illustrated in FIG. 1C, a required number of mirrors m in each mirror row is approximately 788 when the DMD 2 has 12 mirror rows (n=12), and a required number of mirrors m in each mirror row is approximately 148 when the DMD 2 has 64 mirror rows (n=64). If the length of the DMD 2 in the longitudinal direction does not match the width of an image, a light image irradiated from the DMD 2 may be enlarged or reduced as the case may be.

According to this embodiment, it is possible, by use of the microlens 3, to enhance the intensity of irradiated light on each of pixels of a light image irradiated to the photosensitive material 10, increase a speed at which an electrostatic latent image is formed on the photosensitive material 10, and transfer an image having a high image density to the transfer sheet 14 to form the image thereon.

[Embodiment 3]

Figure 7:
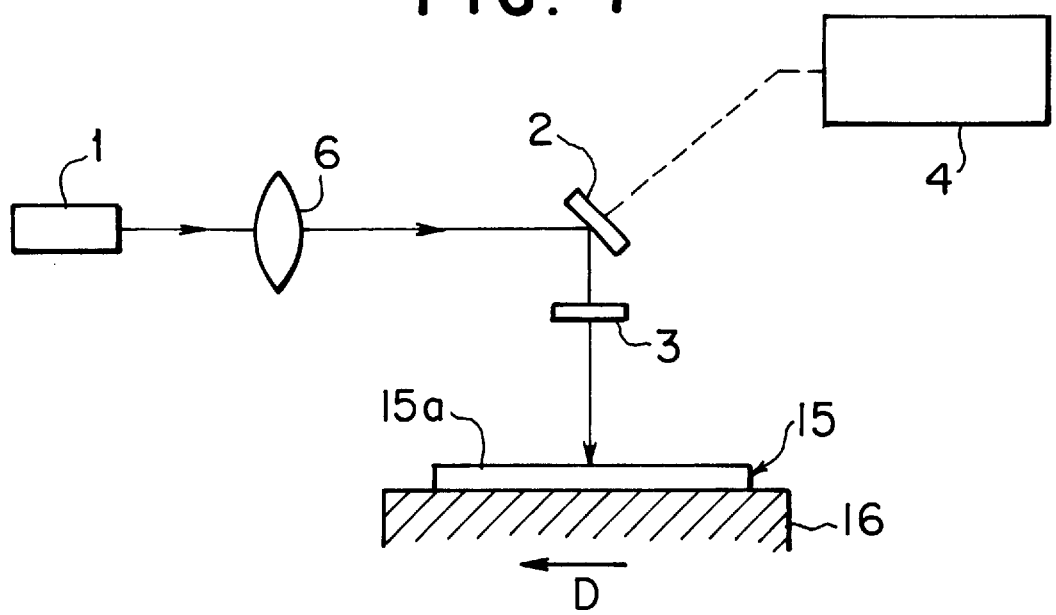
FIG. 7 is a schematic diagram illustrating the configuration of an aligner for lithography according to a third embodiment.

Next, description will be made on an exemplary application for the DMD 2 which is applied to an aligner for lithography. FIG. 7 schematically illustrates the configuration of an aligner according to this embodiment, where parts similar to those in the aforementioned Embodiment 1 illustrated in FIG. 1A are designated with the same reference numerals, and explanation thereon is omitted.

Referring specifically to FIG. 7, a substrate 15 having a photoresist layer 15a formed on the surface thereof is supported on a stage 16 which is driven in a direction indicated by an arrow D. The DMD 2 is controlled to form a target pattern based on digital information data, while the stage 16 is driven in the direction indicated by the arrow D, thereby fully exposing the photoresist layer 15a on the substrate 15. Subsequently, the photoresist pattern 15a on the substrate 15 is developed to form a predetermined resist pattern on the substrate 15.

According to this embodiment, it is possible, by use of the microlens 3, to enhance the intensity of irradiated light on each of pixels on the photoresist layer 15a, increase a speed at which the photoresist layer 15a is exposed, and form a resist pattern having a high line density on the substrate 15.

While in this embodiment, the optical image forming device is applied to the formation of a resist pattern on a substrate, it can also be applied to an aligner such as a so-called stepper for use in the formation of a resist pattern for forming a large number of integrated circuit devices on a semiconductor wafer serving as a substrate.

In describing preferred embodiments of the present invention illustrated in the drawings, specific terminology is employed for the sake of clarity. However, the present invention is not intended to be limited to the specific terminology so selected and it is to be understood that each specific element includes all technical equivalents which operate in a similar manner.

What is claimed is:

1. An optical image forming method for forming a light image on an object, comprising the steps of:

irradiating light from a light source to a spatial light modulator including a plurality of mirrors arranged in an array of mirror rows and mirror columns, with a pitch p for the mirror columns, each of said mirrors capable of independently controlling the inclination of a reflecting surface thereof;

irradiating reflected light from said spatial light modulator to an object which moves in a first direction relative to said reflected light;

arranging said respective mirrors of said spatial light modulator to reflect light therefrom; and converging said reflected light from plural of said respective mirrors in one column of said spatial light modulator onto one pixel of said object such that reflected light images from said mirrors of said spatial light modulator are aligned on said object in a second direction orthogonal to the first direction of the relative movement of said object with a pitch smaller than the pitch p of said mirrors.

2. An optical image forming device for forming a light image on an object, said device comprising:

a light source;

a spatial light modulator including a plurality of mirrors arranged in an array of mirror rows and mirror columns, with a pitch p for the mirror columns, each of said mirrors capable of independently controlling the inclination of a reflecting surface thereof for reflecting light modulator is irradiated to an object which moves in a first direction relative to said reflected light;

a controller which controls the inclination of the reflecting surface of each of said mirrors; and a plurality of lenses each for converging reflected light from a corresponding mirror plural of said mirrors in one column of said spatial light modulator onto one pixel of said object such that reflected light images from said mirrors of said spatial light modulator are aligned on said object in a second direction orthogonal to the first direction of the relative movement of said object with a pitch smaller than the pitch p of said mirrors.

3. An optical image forming device according to claim 2, wherein:

said spatial light modulator includes n mirror rows arranged in the direction of the relative movement, each of said mirror rows including m mirrors arranged with the pitch p in the direction orthogonal to the direction of the relative movement, said mirror rows being arranged with an offset in the direction orthogonal to the direction of the relative movement; and said controller controls the inclination of the reflecting surface of each of said mirrors, such that reflected light images from said respective mirrors are aligned in the direction orthogonal to the direction of the relative movement.

4. An optical image forming device according to claim 2, wherein:

said spatial light modulator includes n mirror rows arranged in the direction orthogonal to a longitudinal direction of said spatial light modulator, each of said mirror rows including m mirrors arranged with the pitch p in the longitudinal direction, to form an array of (n×m) mirrors which constitute said spatial light modulator;

the longitudinal direction of said spatial light modulator is inclined with respect to the direction orthogonal to the direction of the relative movement, so as to sequentially shift the position at which a reflected light image reflected off an $i^{th}$ mirror, wherein i varies 1 to m, in each of said mirror rows is formed in the direction orthogonal to the direction of the relative movement; and said controller controls the inclination of the reflecting surface of each of said mirrors such that reflected light images from said respective mirrors are aligned in the direction orthogonal to the direction of the relative movement.

5. An image forming apparatus, comprising:

a latent image forming mechanism which irradiates a light image to a uniformly charged image carrier to form a latent image;

a developing mechanism which develops the latent image on said image carrier to form an actual image; and a transfer mechanism which transfers the actual image on said image carrier onto a transfer material, an optical image forming device which comprises a light source:

a spatial light modulator including a plurality of mirrors arranged in an array of mirror rows and mirror columns, with a pitch p for the mirror columns, each of said mirrors capable of independently controlling the inclination of a reflecting surface thereof for reflecting light from said light source, wherein reflected light from said spatial light modulator is irradiated to an object which moves in a first direction relative to said reflected light;

a controller which controls the inclination of the reflecting surface of each of said mirrors; and a plurality of lenses each for converging reflected light from a corresponding plural of said mirrors in one column of said spatial light modulator onto one pixel of said object such that reflected light images from said mirrors of said spatial light modulator are aligned on said object in a second direction orthogonal to the first direction of the relative movement of said object with a pitch smaller than the pitch p of said mirrors.

6. An aligner for lithography for irradiating a light image to a substrate having a photoresist layer formed on a surface thereof, said aligner comprising an optical image forming device which comprises:

a light source;

a spatial light modulator including a plurality of mirrors arranged in an array of mirror rows and mirror columns, with a pitch p for the mirror columns, each of said mirrors capable of independently controlling the inclination of a reflecting surface thereof for reflecting light from said light source, wherein reflected light from said spatial light modulator is irradiated to an object which moves in a first direction relative to said reflected light;

a controller which controls the inclination of the reflecting surface of each of said mirrors; and a plurality of lenses each for converging reflected light from a corresponding plural of said mirrors in one column of said spatial light modulator onto one pixel of said object such that reflected light images from said mirrors of said spatial light modulator are aligned on said object in a second direction orthogonal to the first direction of the relative movement of said object with a pitch smaller than the pitch p of said mirrors.

* * * * *

UNITED STATES PATENT AND TRADEMARK OFFICE
CERTIFICATE OF CORRECTION

PATENT NO.   : 6,288,830 B1
DATED        : September 11, 2001
INVENTOR(S)  : Kinoshita It is certified that error appears in the above-identified patent and that said Letters Patent is hereby corrected as shown below:

Column 6,
Line 10, change "CCd" to -- CCD --;
Line 25, change "FIG. 1" to -- FIG. 1C --;
Line 27, after "mirror", insert -- row --.

Column 9,
Line 7, after "light", insert -- from said light source, wherein reflected light from said spatial light --;
Line 12, delete "mirror".

Signed and Sealed this

Twenty-third Day of July, 2002

Attest:

JAMES E. ROGAN
Attesting Officer     Director of the United States Patent and Trademark Office